US011894526B2

(12) United States Patent
Wang et al.

(10) Patent No.: US 11,894,526 B2
(45) Date of Patent: Feb. 6, 2024

(54) SMART BATTERY (71) Applicant: BEIJING INSTITUTE OF TECHNOLOGY, Beijing (CN)

(72) Inventors: Wenwei Wang, Beijing (CN); Yiding Li, Beijing (CN); Fenghao Zuo, Beijing (CN)

(73) Assignee: BEIJING INSTITUTE OF TECHNOLOGY, Beijing (CN)

( * ) Notice: Subject to any disclaimer, the term of this patent is extended or adjusted under 35 U.S.C. 154(b) by 415 days.

(21) Appl. No.: 17/297,345

(22) PCT Filed: Sep. 28, 2020

(86) PCT No.: PCT/CN2020/118278
§ 371 (c)(1),
(2) Date: May 26, 2021

(87) PCT Pub. No.: WO2022/056957
PCT Pub. Date: Mar. 24, 2022

(65) Prior Publication Data
US 2022/0311060 A1 Sep. 29, 2022

(30) Foreign Application Priority Data
Sep. 21, 2020 (CN) .......................... 202010993453.4

(51) Int. Cl.
H01M 10/42 (2006.01)
G01R 31/392 (2019.01)
G01R 31/3842 (2019.01)
H01M 10/0525 (2010.01)
H01M 10/48 (2006.01)

(52) U.S. Cl.
CPC .... *H01M 10/4257* (2013.01); *G01R 31/3842* (2019.01); *G01R 31/392* (2019.01);
(Continued)

(58) Field of Classification Search
None
See application file for complete search history.

(56) References Cited

U.S. PATENT DOCUMENTS 9,954,384 B2 * 4/2018 Hunter ................. H02J 7/0063
10,777,855 B2 * 9/2020 Raghavan .............. G01K 11/32
(Continued)

FOREIGN PATENT DOCUMENTS

CN 103081167 A 5/2013
CN 204632881 U 9/2015
(Continued)

OTHER PUBLICATIONS

International Search Report of the International Searching Authority, dated Jun. 23, 2021, from International Application No. PCT/CN2020/118278, filed on Sep. 28, 2020, 7 pages including 3 pages of English translation.

*Primary Examiner* — Leigh M Garbowski
(74) *Attorney, Agent, or Firm* — HoustonHogle LLP (57) ABSTRACT The present disclosure relates to a smart battery. The smart battery includes a battery shell, layered cells, a positive electrode, a negative electrode, an embedded multi-source sensor group and an intelligent chip. The smart battery can detect the temperature and the pressure of the core of the battery and the current of the battery in real time by using the intelligent chip and the embedded multi-source sensor group, thereby realizing a real-time monitoring of the working state and safety state of the battery, and improving a safety and the reliability of the battery on the basis of realizing the self-sensing function of the battery. The modification to the conventional battery structure by adding the intelligent chip and the embedded multi-source sensor group makes up the gap in research and development, manufac-
(Continued)

turing and production of the smart battery on the premise of ensuring that the battery volume remains unchanged.

8 Claims, 10 Drawing Sheets

(52) U.S. Cl.
CPC ..... *H01M 10/0525* (2013.01); *H01M 10/486* (2013.01); *H01M 2010/4271* (2013.01); *H01M 2010/4278* (2013.01); *H01M 2220/20* (2013.01)

(56) References Cited

U.S. PATENT DOCUMENTS

| | | | |
|---|---|---|---|
| 10,919,990 B2* | 2/2021 | Yang | C08K 5/098 |
| 11,094,973 B2* | 8/2021 | Fortier | H01M 10/486 |
| 11,527,783 B2* | 12/2022 | Ladpli | H01M 10/48 |
| 2016/0028129 A1* | 1/2016 | Raghavan | H01M 10/0459 |
| | | | 429/153 |
| 2018/0321325 A1* | 11/2018 | Fortier | H01M 10/48 |
| 2019/0013554 A1* | 1/2019 | Kotik | H01M 10/482 |
| 2019/0207274 A1* | 7/2019 | Ladpli | H01M 10/48 |

FOREIGN PATENT DOCUMENTS

| | | |
|---|---|---|
| CN | 206002591 U | 3/2017 |
| CN | 106960984 A | 7/2017 |
| CN | 109116249 A | 1/2019 |
| CN | 208820019 U | 5/2019 |
| CN | 110838604 A | 2/2020 |
| CN | 210669575 U | 6/2020 |
| KR | 20170084789 A | 7/2017 |

* cited by examiner

SMART BATTERY

RELATED APPLICATIONS

This application is a § 371 National Phase Application of International Application No. PCT/CN2020/118278, filed on Sep. 28, 2020, not yet published, which International Application claims priority to China Application No. 202010993453.4, filed on Sep. 21, 2020, both of which are incorporated herein by reference in their entirety.

TECHNICAL FIELD

The present disclosure relates to a field of a battery, in particular to a smart battery.

BACKGROUND ART

Development of new energy automobiles is the only way for China to move from a big country to a powerful country in the automobile industry and is a strategic measure for coping with climate change and promoting green development. Developed countries such as Europe, America and Japan have invested heavily and successively issued and implemented new energy automobile development strategies and then enhanced policy support. In recent years, China's new energy automobile industry has developed greatly and achieved remarkable accomplishments and has become an important force for leading a transformation of the world's automobile industry.

Compared with other types of batteries, Lithium ion batteries are well known as the first choice for power batteries for electric automobiles at present and for a long time in the future due to their significant advantages of high specific energy, high specific power and a long cycle life. However, in recent years, promotion of electric automobiles is restricted by inaccurate estimation of the battery endurance mileage and fast decrease of battery power capacity. Continuous accidents have occurred to some well-known brands of electric automobiles, increasing consumers' concerns about the safety of the electric automobiles. Therefore, the China Automotive Technology and Research Center has issued a 2018 version of the C-NCAP new automobile evaluation program, focusing on adding evaluation indicators of the collision safety of new energy automobiles.

In current Battery Management Systems (BMS), a terminal voltage, a current, and a surface temperature of the battery are mainly monitored in real time due to limitations of technology, cost and space. The battery working state, including State of Charge (SOC), State of Health (SOH), State of Power (SOP), and a central temperature of the battery are estimated based on the above monitored physical parameters, thereby comprehensively monitoring the state of the battery, to improve usage efficiency of the battery and ensure the safety state of a battery system. However, since the real-time state of the battery is affected by factors such as charge and discharge rate, temperature, self-discharge and aging, the battery shows a high non-linearity in use, which brings great difficulty for accurately estimating the SOC, SOH and the central temperature of the battery. Although many researches and methods, such as ampere-hour integral method, Kalman filtering method, and neural network method, are used for estimating the state of the battery, the methods cannot accurately estimate the state of the battery of a running vehicle in real time and thus cannot meet the basic usage requirements, since these methods have the disadvantages of poor accuracy, poor real-time performance; and a complicated calculation process.

Intel proposed a smart battery technology in 1990, but such a smart battery technology has not developed greatly with technological development. At present; along with grouped and large-scale battery system, it is more and more difficult for the BMS to manage a large-scale battery, and thus the smart battery begins to show its advantages. At present, it is far from meeting the requirements of the usage and safety of the battery in the new energy automobile industry only by comprehensive information monitoring, management control, system communication and safety warning on the battery via the BMS. The battery is bound to be developed toward self-sensing, self-decision, self-control, etc.

The smart battery has an intelligent function and an ultra-high performance compared with the ordinary battery. The intelligent function is embodied as advanced logical judgment that can be made on various working state information and safety signals and self-sensing and self-warning of the functional state of a single battery at a single battery level. In addition, the intelligent function is embodied as time-sharing scanning, fault reporting, information processing, command transmitting and safety processing at a module level; and it is embodied as the fault recording and an advanced safety processing advice via a connection with the cloud on a system level. The ultra-high performance is based on the intelligent function and is embodied as high energy density, high power density, long cycle life, high reliability, high safety, environmental sustainability, and extendibility which means that the smart battery can adapt to different application scenarios.

However, the smart battery is not widely researched and clearly defined at present. Generally speaking, a smart battery system is a battery power supply system capable of efficiently managing itself, and includes a battery and a control system, wherein the battery stores and supplies energy, and the control system generally includes a single-chip microcomputer system and peripheral detection control modules, to implement intelligent measurement, calculation and management control. The whole smart battery system constitutes a complete, reliable and safe power supply system. However, it can be seen from the above definition, the current smart battery tends to be on the module level and even on the system level and cannot go deep to the single battery level.

Complex BMS functionality can be dispersed into a single battery by realizing the self-sensing and self-warning of the battery on the single battery level, thereby reducing BMS management pressure or even canceling the BMS. The project currently stays at a guidance of the development direction of the BMS, and current research on the development, manufacturing and production of the smart battery are still in a blank state.

SUMMARY

Aiming at the problems in the conventional art, the present disclosure provides a safe and reliable smart battery capable of self-sensing.

In order to achieve the above effect, the present disclosure provides the following solutions:

A smart battery includes a battery shell, layered cells, an embedded multi-source sensor group, an intelligent chip, a positive electrode and a negative electrode; wherein, the layered cells are arranged in the embedded multi-source sensor group; the intelligent chip is arranged between the positive electrode and the negative electrode; the battery shell wraps the embedded multi-source sensor group, the intelligent chip, the positive electrode and the negative electrode, and through holes for receiving the positive electrode, the negative electrode and a data interface of the intelligent chip are formed on the battery shell;

the positive electrode is electrically connected with a positive electrode of the layered cells; the negative electrode is electrically connected with a negative electrode of the layered cells; and the embedded multi-source sensor group is electrically connected with the intelligent chip; the embedded multi-source sensor group is configured to detect a temperature and a pressure of a core of the smart battery and a current inside the smart battery; the intelligent chip is configured to detect a working state of the smart battery in real time according to the temperature and the pressure of the core of the smart battery and the current inside the smart battery.

Optionally, the embedded multi-source sensor group includes a composite sensor and a Hall current sensor; and the composite sensor is embedded between the layered cells; the layered cells are arranged in the Hall current sensor.

Optionally, the composite sensor includes a thin-film temperature sensor, a fiber Bragg grating, a first backplane and a second backplane;

the fiber Bragg grating is embedded in the first backplane and the second backplane; and grooves for receiving the fiber Bragg grating and the thin-film temperature sensor are formed in each of the first backplane and the second backplane;

the thin-film temperature sensor is arranged between the first backplane and the second backplane; and the fiber Bragg grating and the thin-film temperature sensor are both connected with the intelligent chip; the fiber Bragg grating is configured to detect the pressure of the core of the smart battery; and the thin-film temperature sensor is configured to detect the temperature of the core of the smart battery.

Optionally, the Hall current sensor includes a casing, a plurality of annular magnetic belts and Hall sensors, wherein, the number of the Hall sensors is same as that of the annular magnetic belts;

a hollow structure is formed on one side of the casing; the annular magnetic belts are circumferentially attached to an outside of the casing, the hollow structure is formed in a center of a gap between a first end and a second end of the annular magnetic belts attached to the outside of the casing, and the Hall sensors are arranged in the hollow structure; and the layered cells are arranged inside the casing.

Optionally, the intelligent chip includes a Hall current processing unit, a composite sensing modulation and demodulation unit and a central processing unit; wherein the Hall current processing unit is electrically connected with the Hall current sensor; the composite sensing modulation and demodulation unit is electrically connected with the composite sensor; the Hall current processing unit and the composite sensing modulation and demodulation unit are both electrically connected with the central processing unit; and the Hall current processing unit is configured to demodulate a sensing signal obtained by the Hall current sensor to obtain the current of the smart battery; the composite sensing modulation and demodulation unit is configured to demodulate a change of a central wavelength of the fiber Bragg grating to obtain the pressure of the core of the smart battery and to demodulate a virtual voltage signal obtained by the thin-film temperature sensor to obtain the temperature of the core of the smart battery; the central processing unit is loaded with a battery working state management algorithm for determining the battery world rig state and a multi-dimensional safety signal warning logic algorithm; and the central processing unit determines the working state and a safety state of the smart battery according to signals obtained by the Hall current processing unit and the composite sensing modulation and demodulation unit.

Optionally, the intelligent chip further includes a chip substrate, an ultrasonic sensor and a voltage sensor; wherein the ultrasonic sensor is connected with the central processing unit; the voltage sensor is connected with the positive electrode, the negative electrode and the central processing unit; the voltage sensor is configured to detect a voltage change of the smart battery; and the ultrasonic sensor is configured to detect a structural state of the smart battery; and a wireless transmission unit, the Hall current processing unit, the composite sensing modulation and demodulation unit, the central processing unit, the ultrasonic sensor and the voltage sensor are all fixedly arranged on the chip substrate.

Optionally, the intelligent chip further includes a wireless transmission unit; wherein the central processing unit is connected with the wireless transmission unit; and the wireless transmission unit is configured to realize information interaction between the central processing unit and a vehicle management system and/or between the central processing unit and an internet cloud.

Optionally, the battery shell is provided with an intelligent chip groove, a battery groove, a positive electrode groove and a negative electrode groove; wherein the intelligent chip groove, the positive electrode groove and the negative electrode groove are all arranged above the battery groove, and the positive electrode groove and the negative electrode groove are symmetrically arranged with respect to the intelligent chip groove; and the intelligent chip groove is configured to receive the intelligent chip; the battery groove is configured to receive the layered cells and the embedded multi-source sensor group; the positive electrode groove is configured to receive the positive electrode; and the negative electrode groove is configured to receive the negative electrode.

Optionally, the battery shell is further provided with an explosion-proof valve; wherein the explosion-proof valve is positioned between the intelligent chip groove and the battery groove.

Optionally, the layered cells are layered cells of a layered lithium ion battery.

According to specific embodiments provided by the present disclosure, the following technical effects are disclosed by the present disclosure:

according to the smart battery provided by the present disclosure, the temperature and the pressure of the core of the battery and the current of the battery can be detected in real time by using the intelligent chip and the embedded multi-source sensor group, thereby realizing a real-time monitoring of the working state and safety state of the battery, and improving a safety and the reliability of the battery on the basis of realizing the self-sensing function of the battery.

In addition; according to the smart battery provided by the present disclosure, a modification to the conventional battery structure by adding the intelligent chip and the embedded multi-source sensor group makes up a gap in research and development, manufacturing and production of the smart battery on the premise of ensuring that the battery volume remains unchanged.

BRIEF DESCRIPTION OF THE DRAWINGS

In order to more clearly illustrate embodiments of the present disclosure or technical solutions in the conventional technology, accompanying drawings used in the embodiments will be described briefly. It is obvious that the drawings described below are only some embodiments of the present disclosure, and that those skilled in the art can obtain other drawings from these drawings without involving any inventive effort.

SYMBOLS DESCRIPTION

1—battery shell, 11—intelligent chip groove, 12—battery groove, 13—positive electrode groove, 14—negative electrode groove, 15—explosion-proof valve, 2—layered cell, 3—embedded multi-source sensor group, 31—composite sensor, 311—thin-film temperature sensor, 312—fiber Bragg grating, 313—first backplane, 314—second backplane, 3131—first groove, 3141—second groove, 32—Hall current sensor, 321—casing, 322—annular magnetic belt, 323—Hall sensor, 4—intelligent chip, 41—Hall current processing unit, 42—composite sensing modulation and demodulation unit, 43—central processing unit, 44—chip substrate, 45—ultrasonic sensor, 46—voltage sensor, 47—data interface, 48—wireless transmission unit, 5—positive electrode, 6—negative electrode.

DETAILED DESCRIPTION OF THE EMBODIMENTS

In the following, technical solutions in the embodiments of the present disclosure will be clearly and completely described with reference to the drawings in the embodiments of the present disclosure. Obviously, the described embodiments are only a part of the embodiments of the present disclosure, rather than all the embodiments. Based on the embodiments of the present disclosure, all other embodiments obtained by a person of ordinary skill in the art without involving any inventive effort fall within the scope of the present disclosure.

The present disclosure intends to provide a safe and reliable smart battery capable of self-sensing.

The smart battery is defined as an advanced multifunctional battery which is provided with an embedded multi-source sensor and an implanted intelligent chip and capable of monitoring and managing and controlling multiple battery working state signals (such as SOC, SOH, SOP) and safety signals (such as a temperature of an internal core, a voltage, a current, a pressure, a strain, a structure evolution) in real time, realizing state sharing and battery balancing among single batteries in a wired and wireless mode, transmitting battery data to a vehicle management unit or an Internet cloud by using a data interface or a wireless transmission module, and realizing self-sensing, self-decision and self-control of battery working state and safety state.

To further clarify the above objects, features and advantages of the present disclosure, a more particular description of the disclosure will be rendered by reference to the accompanying drawings and specific embodiments thereof.

Figure 1:
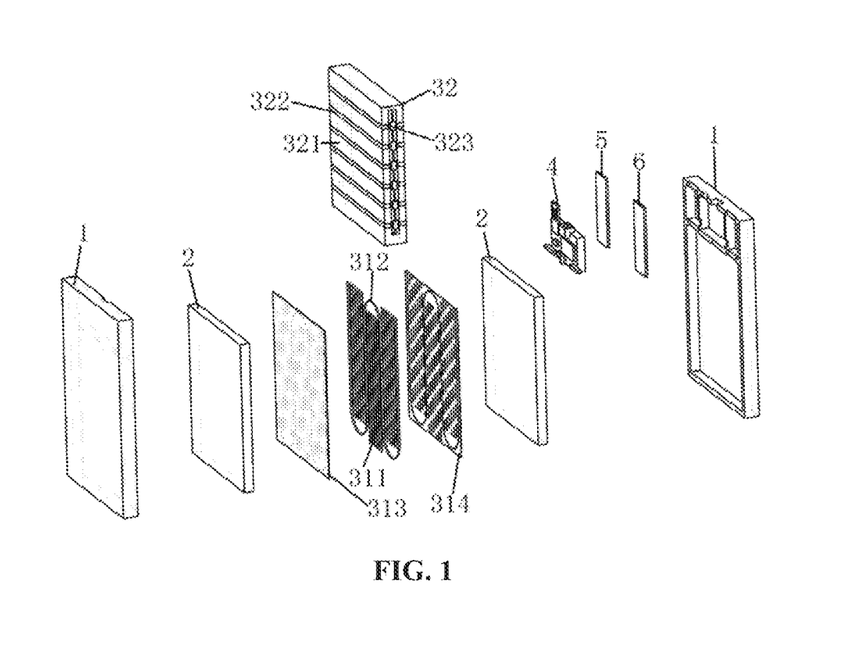
FIG. 1 is an exploded structural view of a smart battery according to the present disclosure.
Figure 2:
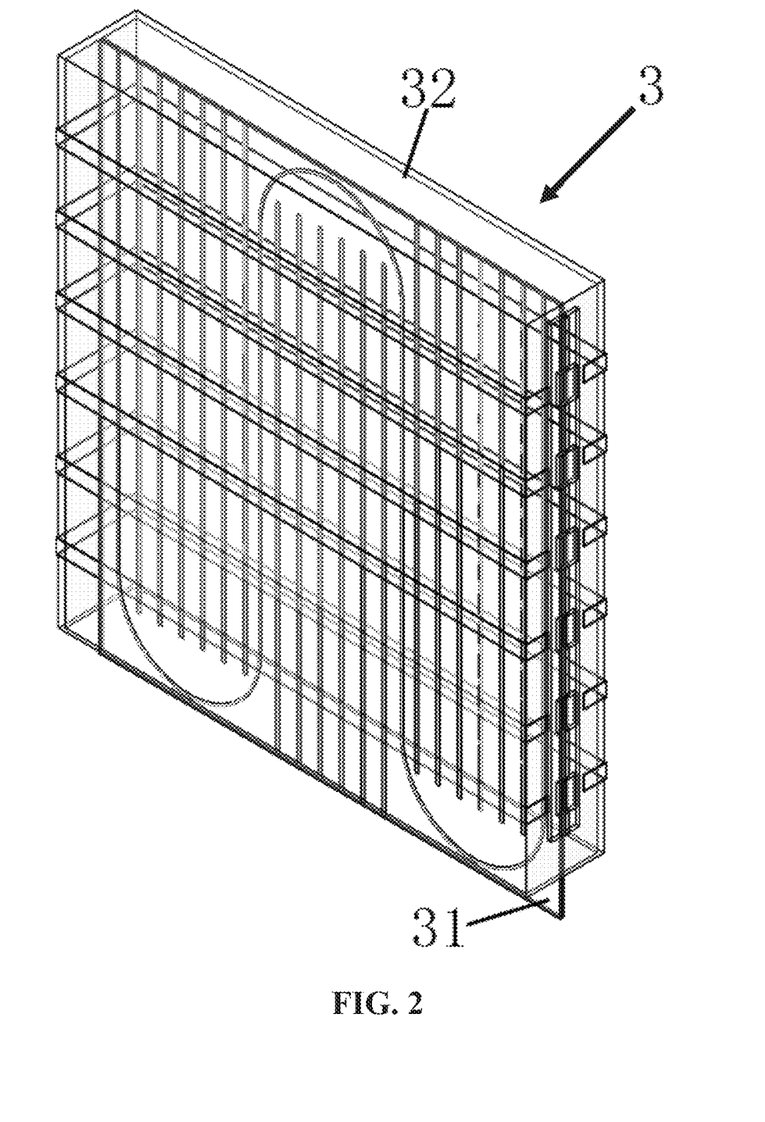
FIG. 2 is a schematic structural view of an embedded multi-source sensor group according to an embodiment of the present disclosure.

FIG. 1 is an exploded structural view of a smart battery according to the present disclosure. FIG. 2 is a schematic structural view of an embedded multi-source sensor group according to an embodiment of the present disclosure. As shown in FIGS. 1-2, the smart battery includes a battery shell 1, layered cells 2, an embedded multi-source sensor group 3, an intelligent chip 4, a positive electrode 5 and a negative electrode 6.

The layered cells 2 are arranged in the embedded multi-source sensor group 3. The intelligent chip 4 is arranged between the positive electrode 5 and the negative electrode 6. The battery shell 1 wraps the embedded multi-source sensor group 3, the intelligent chip 4, the positive electrode 5 and the negative electrode 6, and through holes for receiving the positive electrode 5, the negative electrode 6 and the data interface 47 of the intelligent chip 4 are formed on the battery shell 1.

The positive electrode 5 is electrically connected with a positive electrode of the layered cells 2. The negative electrode 6 is electrically connected with a negative electrode of the layered cells 2.

The embedded multi-source sensor group 3 is electrically connected with the intelligent chip 4. The embedded multi-source sensor group 3 is configured to detect a temperature and a pressure of a core of the smart battery and a current inside the smart battery. The intelligent chip 4 is configured to detect a working state of the smart battery in real time according to the temperature and the pressure of the core of the smart battery and the current inside the smart batter-.

The layered cells 2 are optionally layered cells of a layered lithium ion battery but are not limited thereto.

Figure 3:
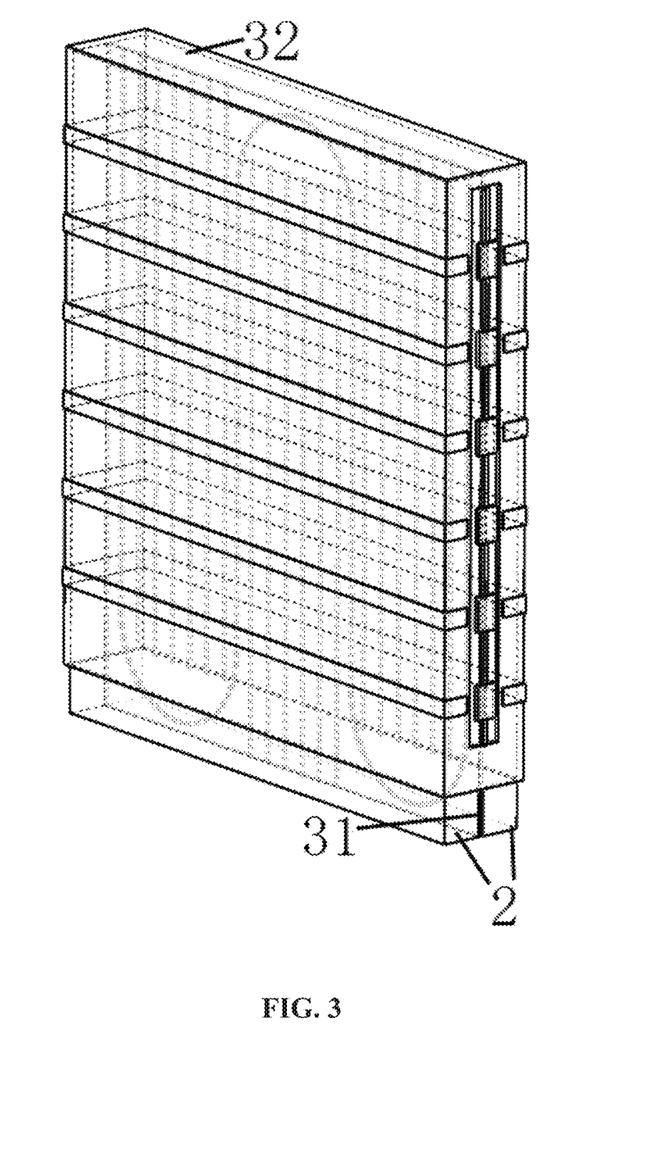
FIG. 3 is a schematic structural view of an embedded multi-source sensor group embedded with layered cells according to an embodiment of the present disclosure.

As shown in FIG. 2 and FIG. 3, the above embedded multi-source sensor group 3 includes a composite sensor 31 and a Hall current sensor 32.

The composite sensor 31 is embedded between the layered cells 2. The layered cells 2 embedded with the composite sensor 31 are arranged in the Hall current sensor 32.

Figure 4:
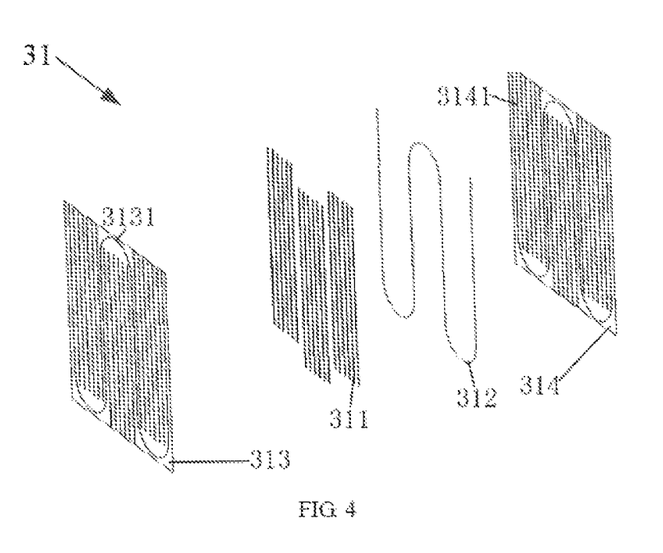
FIG. 4 is an exploded structural view of a composite sensor according to an embodiment of the present disclosure.

As shown in FIG. 4, the composite sensor 31 includes: a thin-film temperature sensor 311, a fiber Bragg grating (FBG) 312, a first backplane 313 and a second backplane 314.

Figure 5:
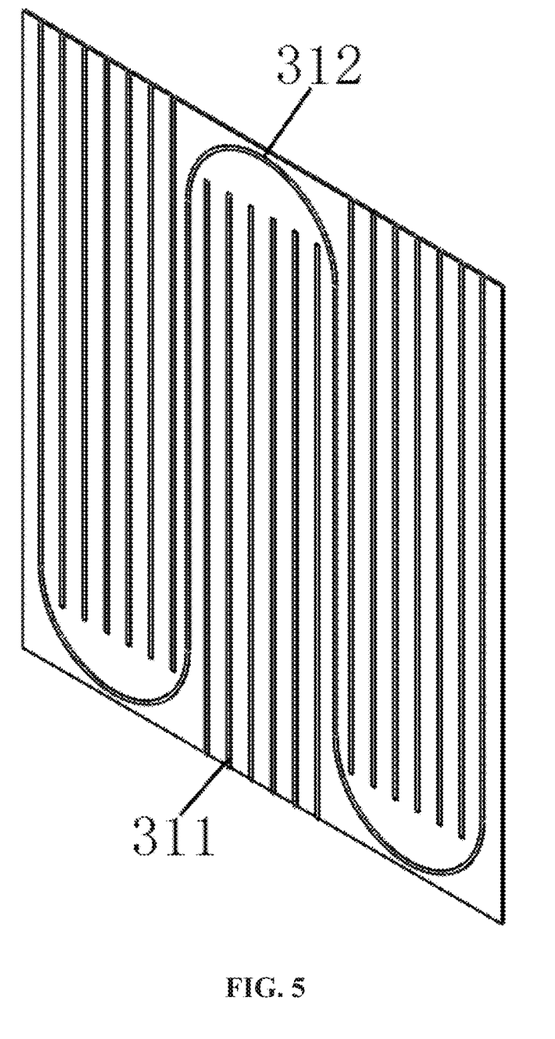
FIG. 5 is a schematic structural view of a composite sensor according to an embodiment of the present disclosure.

The FBG 312 is embedded in the first backplane 313 and the second backplane 314, as shown in FIG. 5. Grooves (a first groove 3131 and a second groove 3141) for receiving the FBG 312 and the thin-film temperature sensor 311 are formed in each of the first backplane 313 and the second backplane 314. The first groove 3131 is configured to receive the FBG 312, and the second groove 3141 is configured to receive the thin-film temperature sensor 311.

The FBG 312 and the thin-film temperature sensor 311 are both connected with the intelligent chip 4. The FBG 312 is configured to detect the pressure of the core of the smart battery. The thin-film temperature sensor 311 is configured to detect the temperature of the core of the smart battery.

Figure 6:
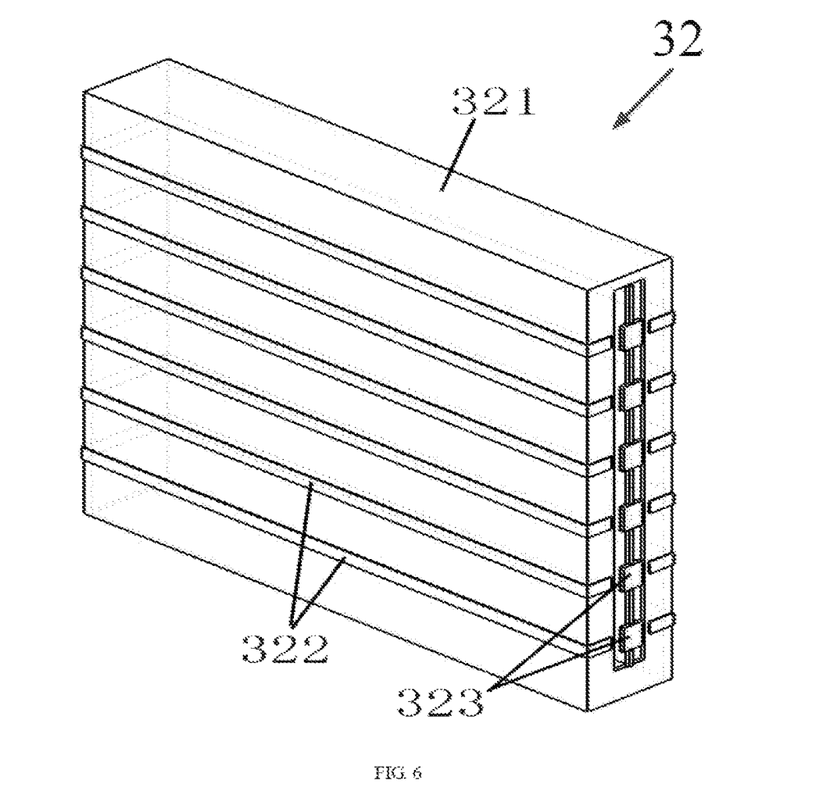
FIG. 6 is a schematic structural view of a Hall current sensor according to an embodiment of the present disclosure.

As shown in FIG. 6, the Hall current sensor 32 includes: a casing 321, a plurality of annular magnetic belts 322 and Hall sensors 323, wherein the number of the Hall sensors 323 is same as that of the annular magnetic belts 322.

A hollow structure is formed on one side of the casing 321. The annular magnetic belts 322 are circumferentially attached to an outside of the casing 321, the hollow structure is formed in a center of a gap between first and second ends of the annular magnetic belts 322 attached to the outside of the casing 321, and the Hall sensors 323 are arranged in the hollow structure.

The layered cells 2 embedded with the composite sensor 31 are arranged inside the casing 321.

Figure 7:
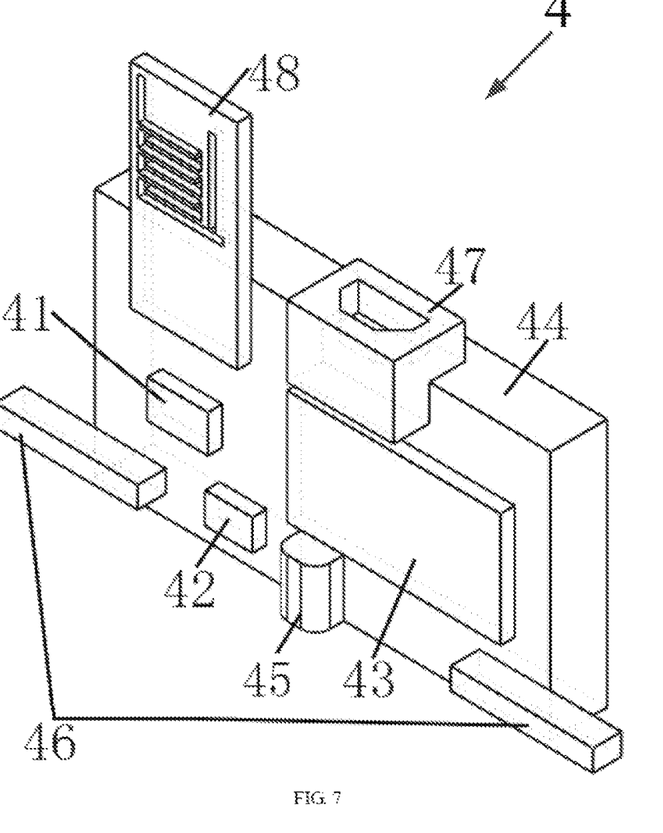
FIG. 7 is a schematic structural view of an intelligent chip according to an embodiment of the present disclosure.

As shown in FIG. 7, the intelligent chip 4 includes: a Hall current processing unit 41, a composite sensing modulation and demodulation unit 42 and a central processing unit 43.

The Hall current processing unit 41 is electrically connected with the Hall current sensor 32. The composite sensing modulation and demodulation unit 42 is electrically connected with the composite sensor 31. The Hall current processing unit 41 and the composite sensing modulation and demodulation unit 42 are both electrically connected with the central processing unit 43.

The Hall current processing unit 41 is configured to demodulate a sensing signal obtained by the Hall current sensor 32 to obtain the current of the smart battery. The composite sensing modulation and demodulation unit 42 is configured to demodulate a change of a central wavelength of the FBG 312 to obtain the pressure of the core of the smart battery and demodulate a virtual voltage signal obtained by the thin-film temperature sensor 311 to obtain the temperature of the core of the smart battery. The central processing unit 43 is loaded with a battery working state management algorithm for determining the battery working state and a multi-dimensional safety signal warning logic algorithm. The central processing unit 43 determines the working state and a safety state of the smart battery according to signals obtained by the Hall current processing unit 41 and the composite sensing modulation and demodulation unit 42.

In order to further detect the safety state of the smart battery, as shown in FIG. 7, the intelligent chip 4 further includes: a chip substrate 44, an ultrasonic sensor 45 and a voltage sensor 46.

The ultrasonic sensor 45 is connected with the central processing unit 43. The voltage sensor 46 is connected with the positive electrode 5, the negative electrode 6 and the central processing unit 43. The voltage sensor 46 is configured to detect a voltage change of the smart battery. The ultrasonic sensor 45 is configured to detect a structural state of the smart battery so that the intelligent chip 4 determines the structural change according to a signal detected by the ultrasonic sensor 45.

A wireless transmission unit 48, the Hall current processing unit 41, the composite sensing modulation and demodulation unit 42, the central processing unit 43, the ultrasonic sensor 45 and the voltage sensor 46 are all fixedly arranged on the chip substrate 44.

As shown in FIG. 7, in order to facilitate information interaction between the smart battery and the vehicle system or the cloud, the intelligent chip 4 further includes a wireless transmission unit 48. The central processing unit 43 is connected with the wireless transmission unit 48. The wireless transmission unit 48 is configured to realize information interaction between the central processing unit 43 and a vehicle management system and/or between the central processing unit 43 and an internet cloud.

Figure 8:
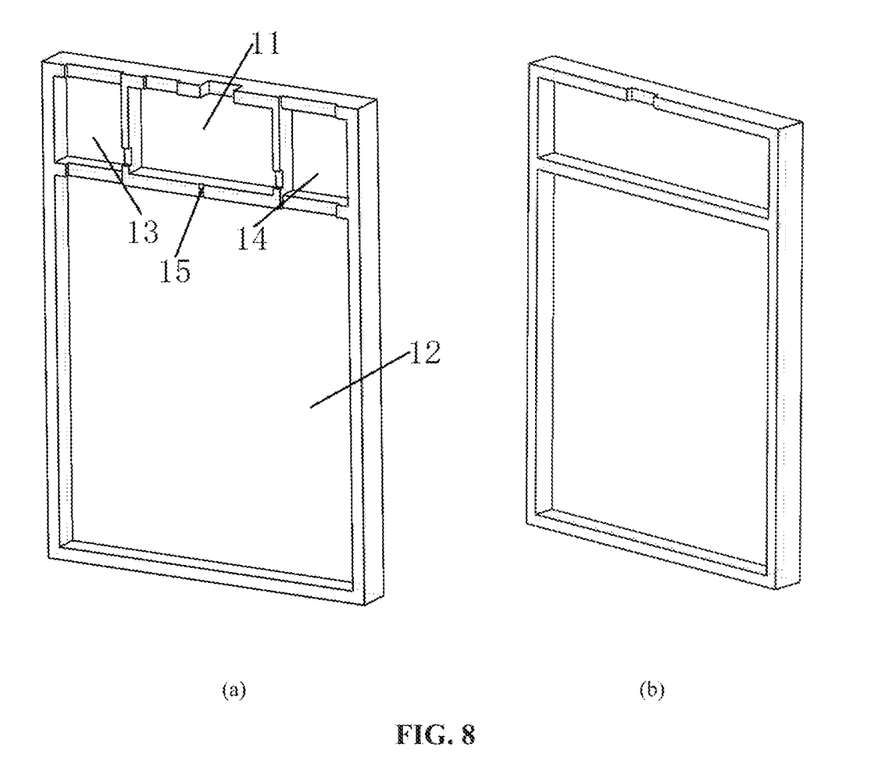
FIG. 8 is a schematic structural view of a battery shell according to an embodiment of the present disclosure.

As shown in FIG. 8, the battery shell 1 is provided with an intelligent chip groove 11, a battery groove 12, a positive electrode groove 13 and a negative electrode groove 14.

The intelligent chip groove 11, the positive electrode groove 13 and the negative electrode groove 14 are all arranged above the battery groove 12, and the positive electrode groove 13 and the negative electrode groove 14 are symmetrically arranged with respect to the intelligent chip groove 11.

The intelligent chip groove 11 is configured to receive the intelligent chip 4. The battery groove 12 is configured to receive the layered cells 2 and the embedded multi-source sensor group 3. The positive electrode groove 13 is configured to receive the positive electrode 5. The negative electrode groove 14 is configured to receive the negative electrode 6.

In order to prevent the smart battery from exploding, as shown in FIG. 8, an explosion-proof valve 15 is further provided on the battery shell 1.

The explosion-proof valve 15 is positioned between the intelligent chip groove 11 and the battery groove 12.

Figure 9:
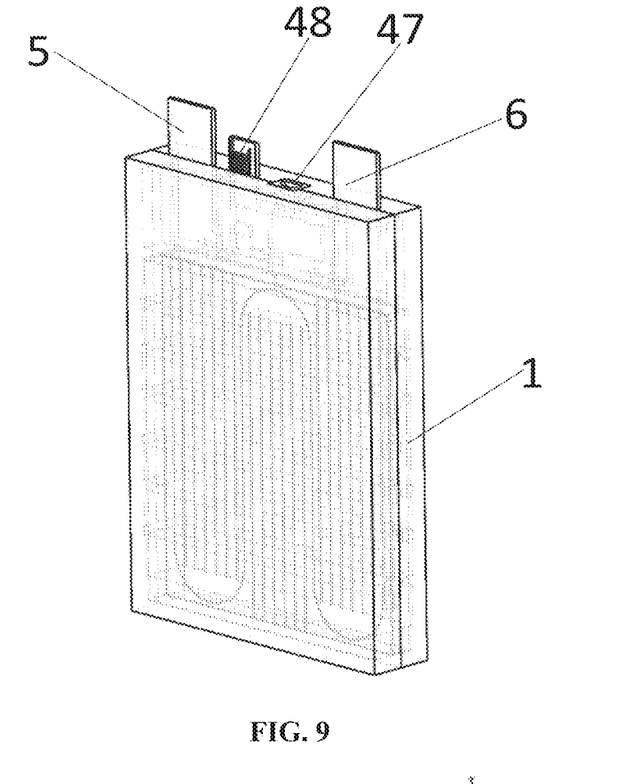
FIG. 9 is an overall structural view of a smart battery according to an embodiment of the present disclosure.

In summary, the overall structure of the constructed smart battery is shown in FIG. 9.

The difference between the smart battery provided by the present disclosure and the conventional battery lies in that the smart battery not only has conventional functional components for charging and discharging, which the conventional battery also has, such as electrodes, a battery shell 1 and layered cells 2 (generally including an positive active material, a positive current collector, a diaphragm, a negative active material, a negative current collector and electrolyte), but also has the multi-source sensor capable of monitoring the working state and the safety state of the battery and the intelligent chip 4 for processing the sensing signals of the battery, Therefore, the smart battery provided by the present disclosure is obtained by modifying a structure of the conventional battery.

Functions of the smart battery provided by the present disclosure will be further explained based on the specific working principle of each sensing component in the smart battery provided by the present invention.

As shown in FIG. 1, the smart battery provided by the present disclosure sequentially includes, from left to right, the battery shell 1, a first layered cell 2 of the layered cells 2, the first backplane 313, the FBG 312, the thin-film temperature sensor 311, the Hall current sensor 32, the second backplane 314, a second layered cell 2 of the layered cells 2, the intelligent chip 4, electrodes (the positive electrode and the negative electrode), and the battery shells 1. The two battery shells 1 are configured to protect components such as the layered cells 2, the embedded multi-source sensor group 3 and the intelligent chip 4. The layered cells 2 are layered cells of a conventional layered lithium ion battery, which are core components for charging and discharging the battery. The first backplane and the second backplane wrap the FBG fiber grating 312 and the thin-film temperature sensor 311, so as to protect fragile sensor components. The FBG fiber grating 312 is configured to detect the pressure and temperature of the core of the battery, and the thin-film temperature sensor 311 is configured to detect the temperature of the core of the battery. The Hall current sensor 32 is configured to detect the current inside the battery. The intelligent chip 4 carries a processing module, a communication module, and a central processor chip (the central processing unit 43) of each sensor. The positive and negative electrodes are directly connected with two electrodes of the layered cells 2, to realize the storage and output of electric energy.

The embedded multi-source sensor group 3 includes the composite sensor 31 and the Hall current sensor 32, the structure of which is shown in FIG. 2. The composite sensor 31 is arranged in a center of a casing 321 of the Hall current sensor 32 and is fixed inside the Hall current sensor 32 by an adhesive bonding process. The FBG fiber grating 312 in the embedded multi-source sensor group 3 realizes the coupling detection of the temperature and pressure of the core of the battery, the thin-film temperature sensor 311 realizes the monitoring the temperature of the core of the battery, and the composite sensor 31 including the FBG fiber grating and the thin-film temperature sensor realizes a decoupling measurement of the temperature and the pressure by calculation and analysis by the CPU of the intelligent chip 4. The Hall current sensor 32 monitors the current of the cells based on the Hall principle.

The calculation and the analysis procedure of the CPU in intelligent chip 4 include:

An expansion force applied to the FBG fiber grating 312 can be regarded as a uniform radial force since the sensor of the FBG fiber grating 312 is wrapped and fixed by the first and second backplanes.

According to a related theory, under an action of the uniform radial force, a change in refractive index of the FBG fiber grating 312 in an X direction (a transverse radial direction of the fiber) is different from that in a Y direction (a longitudinal radial direction of the fiber), and wavelength changes in different polarization directions are shown in formula (1) and formula. (2), $$\Delta\lambda_{Bx} = \left[\frac{(\Delta n_{eff})_x}{n_{eff}} + \varepsilon_z\right]\lambda_{B0} \quad (1)$$

$$\Delta\lambda_{By} = \left[\frac{(\Delta n_{eff})_y}{n_{eff}} + \varepsilon_z\right]\lambda_{B0} \quad (2)$$

Wherein, $\Delta\lambda_B$ is a change amount of the wavelength, $\Delta n_{eff}$ is a change amount of effective refractive index, and $\varepsilon_z$ is strain in a Z direction (an axial direction of the fiber). And a condition of a plane strain is represented as $\varepsilon_z=0$, and $\lambda_{B0}$ is an original center wavelength of the fiber grating.

By analyzing formula (1) and formula (2), it is known that change amounts of center wavelengths of the fiber grating in the two polarization directions are only related to the change in the refractive index under the condition of the plane strain. And it can be known from experiments that the change amounts of the center wavelengths in the two polarization directions have a linear relation with a force, and thus a load force applied to the battery can be directly measured from the change in the central wavelength.

The stress expressions in different directions in the battery under a transverse and uniform load distribution are shown as formula (3) and formula (4) according to a principle of material mechanics.

$$\sigma_x = \frac{2F}{\pi LD} \quad (3)$$

$$\sigma_y = -\frac{6F}{\pi LD} \quad (4)$$

Wherein, F is a uniform radial force, L is a length of a fiber grating, and D is a diameter of a fiber.

The strains of the fiber in all directions can be obtained, as shown in formulas (5) to (7):

$$\varepsilon_x = \frac{1}{E}[\sigma_x - v(\sigma_y + \sigma_z)] \quad (5)$$

$$\varepsilon_y = \frac{1}{E}[\sigma_y - v(\sigma_x + \sigma_z)] \quad (6)$$

$$\varepsilon_z = \frac{1}{E}[\sigma_z - v(\sigma_y + \sigma_x)] \quad (7)$$

Wherein, E is an elastic modulus, and v is the Poisson's ratio. And $\varepsilon_z=0$ when the fiber grating is in the condition of the plane strain, then $\sigma_z=v(\sigma_y+\sigma_x)$.

The temperature of the battery would rise during the use of the battery, such that then the temperature effect will act on the offset of the center wavelength of the fiber grating. And the temperature sensitivity is expressed as formula (8):

$$\frac{\Delta\lambda_B}{\lambda_B \cdot \Delta T} = \varsigma + \alpha \quad (8)$$

Wherein, $\lambda_B$ is a wavelength of the fiber, $\Delta T$ is a temperature rise, $\varsigma$ is a thermo-optical coefficient, and $\alpha$ is a coefficient of thermal expansion.

Based on that the offset of the central wavelength of the FBG fiber grating 312 is in a linear relation with the strain and the temperature, and the thin-film temperature sensor 311 in the composite sensor 31 can feed back the temperature of the core of the battery in real time, the temperature can be subtracted from the amount of the change in the central wavelength of the FBG fiber grating 312, thereby realizing a decoupling monitoring of the temperature and the pressure.

Figure 10:
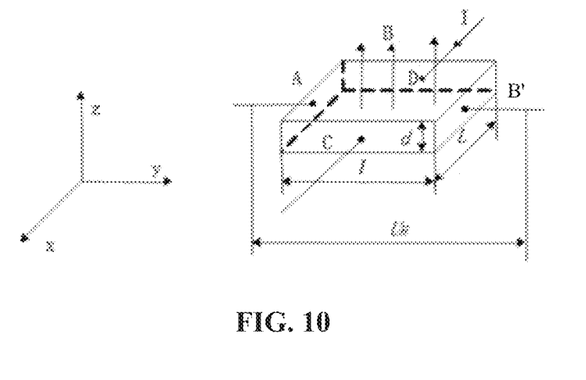
FIG. 10 is a schematic view of an operation of the Hall element according to the present disclosure.

The operating principle of the Hall element is shown in FIG. 10, wherein A and B' are Hall electrodes, C and D are control electrodes, I is a current, B is magnetic field intensity, d is a thickness of the Hall element, L is a width of the Hall electrode, 1, is a length of the Hall electrode, and UH is a voltage.

The conductive carrier is subjected to a Lorentz force $F_L$=−evB along a negative direction of the y-axis under an action of a magnetic field along the z-axis direction, a Hall coefficient $R_H$ of the Hall sensor 323 is $$R_H = -\frac{1}{ne},$$

and the sensitivity $K_H$ of the Hall element is $$K_H = \frac{R_H}{d},$$

wherein e is electron volt, v is a movement speed of the electron, B is a magnetic field intensity, and n is the number of electrons.

According to the formula of the sensitivity of the Hall element, the thickness d of the Hall element is inversely proportional to KH, that is, the smaller d, the larger KH and the higher Hall sensitivity. Therefore, the Hall element can be made thinner, which is good for an integrated design of the sensor, and the real-time monitoring of the current signal of the battery can be advantageously realized by integrally manufacturing and implanting the Hall element and the fiber grating matrix as shown in FIGS. 2 and 3 into the battery.

Figure 11:
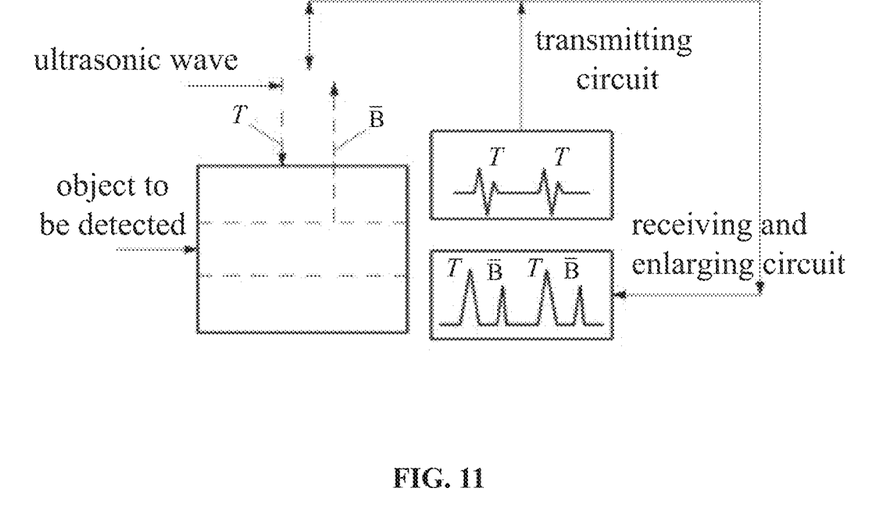
FIG. 11 is a schematic view of a flaw detection of an ultrasonic sensor according to an embodiment of the present disclosure.

FIG. 11 shows a principle of flaw detection of an ultrasonic structure, where T is a start pulse and $\overline{B}$ is a flaw pulse in FIG. 11. Under complex working conditions such as charge-discharge cycle, road vibration and vehicle collision, tiny changes will occur to the structure of the battery. Even dangerous structure damages such as cracks will occur and thus seriously threaten the use safety of the battery. The safety state of the smart battery in use is detected based on the phenomenon that the energy of ultrasonic waves gradually decreases with an increase of a propagation distance in the medium.

The assembly structure of the Hall current sensor 32 and the layered cells 2 is as shown in FIG. 6. The composite sensor 31 installed in a center of the Hall current sensor 32 divides an internal space of the casing 321 of the Hall current sensor 32 into halves, and two cells are respectively arranged in the space near both sides of the casing 321. In this way, the cells, the Hall current sensor 32 and the composite sensor 31 form a structure capable of monitoring parameters of the core of the battery in real time.

The composite sensor 31 has a structure as shown in FIG. 5, in which the FBG 312 is embedded in the first backplane and the second backplane. FIG. 4 shows an exploded structure of the composite sensor 31, where grooves for the sensor of the FBG fiber grating 312 and grooves for the thin-film temperature sensor 311 are engraved on the backplanes of the composite sensor 31, and grooves for the sensors are configured to fix small sensors at a certain position, thereby preventing the sensors from being displaced due to the movement of a battery and preventing damage to the structures of the electrodes. Additionally, the grooves for the sensors can restrict an axial movement of the FBG fiber grating 312, thereby the axial strain of the FBG fiber grating 312 being 0, that is, $\varepsilon_z=0$, corresponding to a generation of a plane strain. The grooves also restrict the movement of the thin-film temperature sensor 311, ensuring a proper measurement of the temperature of the core of the battery.

FIG. 6 shows the structure of the Hall current sensor 32, which includes the casing 321, the annular magnetic belts 322 and the Hall sensors 323. Herein, one side of the casing 321 is hollowed out, the annular magnetic belts 322 are circumferentially attached to the casing 321, and the Hall sensors 323 are arranged in the hollowed structure and placed in gaps of the annular magnetic belts 322. The Hall current sensor 32 detects a change in a magnetic field based on the Hall principle, thereby sensing the current of the cells.

FIG. 7 shows the structure and component of the intelligent chip 4, wherein, the Hall current processing unit 41 is mounted on the chip substrate 44 and mainly configured to process a sensing signal of the Hall current sensor 32. The modulation and demodulation module of the composite sensor 31 is mainly configured to transmit, receive and process a wavelength signal of the FBG fiber grating 312 and a virtual voltage signal of the thin-film temperature sensor 311. The ultrasonic sensor 45 is provided with an ultrasonic probe to detect a structural state of the smart battery in use based on the phenomenon that the energy of ultrasonic waves gradually decreases with an increase of a propagation distance in the medium. The voltage sensor 46 is directly connected to the positive and negative electrodes of the smart battery to monitor a voltage change of the smart battery in use. The data interface 47 adopts a universal data interface 47 to be wired or wirelessly connected to the vehicle management unit, so as to transmit battery states and receive command signals from the vehicle management unit. The wireless transmission module can also wirelessly transmit the relevant information about the working state and the safety state of the smart battery to the Internet cloud and receive commands from the Internet cloud. The central processing unit 43 (CPU) is loaded with algorithms such as an intelligent algorithm and sensing signal analysis to analyze and calculate the sensing signals transmitted by components, and determines the working state parameters and the safety state of the smart battery by combining the battery working state determining algorithm and the safety algorithm, so as to warn of possible dangers to the smart battery in time and respond to commands transmitted from the vehicle management unit and the cloud.

The central processing unit 43, like a brain of the smart battery, monitors and determines a multidimensional working signal of the battery in real time and conducts a real-time two-way communication with a vehicle management unit or the Internet cloud.

Since working signals of the battery are related to different logic systems and safety signals have different warning weights, the central processing unit 43 is loaded with a battery working state management algorithm and a multidimensional safely signal warning logic algorithm, thereby realizing self-sensing, self-decision and self-control on the battery working state under complex working conditions.

The smart battery has an important feature capable of a two-way communication with an external upper-level management unit or the cloud and responding to higher-level control commands in time, Herein, a cluster composed of the central processing units 43 of all single batteries can share all battery working information and realize a battery balance at the single battery level, to form a distributed intelligent control group, thereby extending battery life and maintaining battery performance.

The battery shell 1 is composed of a left battery sub-shell and a right battery sub-shell (as shown in part (a) and part (b) of FIG. 8), which is configured to protect components such as the layered cells 2, the embedded multi-source sensor group 3 and the intelligent chip 4 of the smart battery. The intelligent chip groove 11 arranged on the battery shell 1 is configured to install and fix the intelligent chip 4, The explosion-proof valve 15 is configured to automatically open to release pressure when the voltage in the battery is overlarge, so as to ensure the use safety of the battery. The electrode grooves are configured to install and fix the positive electrode 5 and the negative electrode 6. The battery groove 12 is configured to install and fix functional components of the battery, such as the embedded multisource sensors and the cells. The specific positional relation among the grooves is shown in part (a) of FIG. 8.

Figure 12:
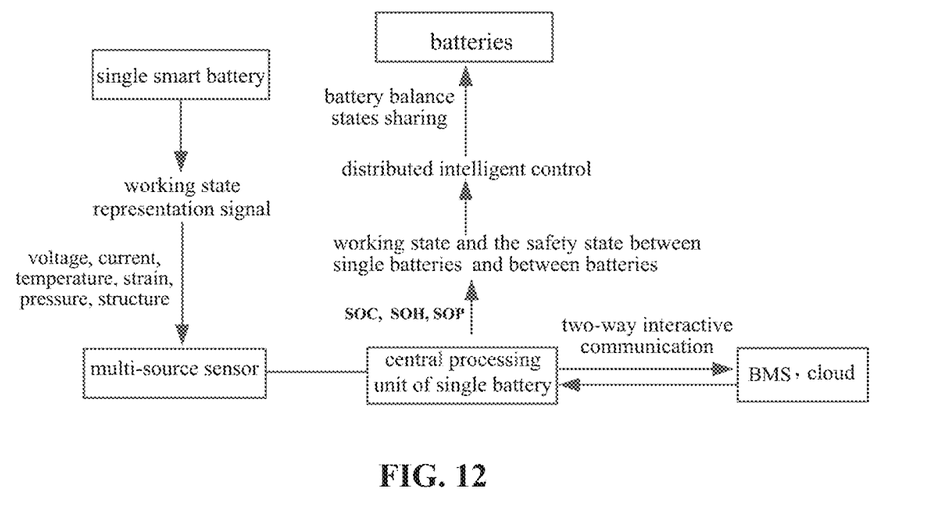
FIG. 12 is a schematic view of an operation of a smart battery according to an embodiment of the present invention.

The working logic of the smart battery provided by the present disclosure is shown in FIG. 12. The working state representation signals of the smart battery involve a voltage signal, a current signal, a temperature signal, a pressure signal, a structure signal etc., and the battery state monitoring sensors include multiple sensors such as the voltage sensor 46, the Hall current sensor 32, the fiber FBG grating sensor, the thin-film temperature sensor 311, and the ultrasonic sensor 45, which are safely embedded into the core of the battery to monitor the working signals of the core of the battery in real time. Each state monitoring sensor of the smart battery transmits a battery working signal to the central processing unit 43. The central processing unit 43 then calculates the battery working state and the warning weight coefficient according to an embedded algorithm, monitors the battery working state and the safety state in real time, communicates related information with the upper-level management unit, and receives related commands from the vehicle management unit or the Internet cloud, and the central processing unit 43. The vehicle management unit and the cloud thus form a two-way interactive communication mechanism. The single battery communicates the working state with other single batteries in the system through the central processing unit 43 and determines the working conditions among the batteries according to the embedded algorithm to balance the battery states, thereby realizing the long-term battery life and performance.

The various embodiments in this description are described in a progressive manner, and each embodiment focuses on the differences from others, and the same or similar parts among embodiments can be referred to each other.

The principles and implementation of the present disclosure have been described herein with specific examples, and the above embodiments are presented to aid in the understanding of the methods and core concepts of the present disclosure; meanwhile, those skilled in the art may make some changes in both the detailed description and an application scope according to the teachings of this disclosure. In conclusion, the contents of the description should not be construed as limiting the disclosure.

What is claimed is:

1. A smart battery, comprising: a battery shell, layered cells, an embedded multi-source sensor group, an intelligent chip, a positive electrode and a negative electrode; wherein
    the layered cells are arranged in the embedded multi-source sensor group; the intelligent chip is arranged between the positive electrode and the negative electrode; the battery shell wraps the embedded multi-source sensor group, the intelligent chip, the positive electrode and the negative electrode, and through holes for receiving the positive electrode, the negative electrode and a data interface of the intelligent chip are formed on the battery shell;
    the positive electrode is electrically connected with a positive electrode of the layered cells; the negative electrode is electrically connected with a negative electrode of the layered cells;
    the embedded multi-source sensor group is electrically connected with the intelligent chip; the embedded multi-source sensor group is configured to detect a temperature and a pressure of a core of the smart battery and a current inside the smart battery; the intelligent chip is configured to detect a working state of the smart battery in real time according to the temperature and the pressure of the core of the smart battery and the current inside the smart battery;
    wherein
    the embedded multi-source sensor group comprises a composite sensor and a Hall current sensor; the composite sensor is embedded between the layered cells, and the layered cells are arranged in the Hall current sensor;
    the composite sensor comprises a thin-film temperature sensor, a fiber Bragg grating, a first backplane and a second backplane;
    the fiber Bragg grating is embedded in the first backplane and the second backplane;
    and grooves for receiving the fiber Bragg grating and the thin-film temperature sensor are formed in each of the first backplane and the second backplane;
    the thin-film temperature sensor is arranged between the first backplane and the second backplane; and
    the fiber Bragg grating and the thin-film temperature sensor are both connected with the intelligent chip; the fiber Bragg grating is configured to detect the pressure of the core of the smart battery; and the thin-film temperature sensor is configured to detect the temperature of the core of the smart battery.

2. The smart battery of claim 1, wherein the Hall current sensor comprises a casing, a plurality of annular magnetic belts and Hall sensors, wherein
    a number of the Hall sensors is same as that of the annular magnetic belts;
    a hollow structure is formed on one side of the casing; the annular magnetic belts are circumferentially attached to an outside of the casing, the hollow structure is formed in a center of a gap between a first end and a second end of the annular magnetic belts attached to the outside of the casing, and the Hall sensors are arranged in the hollow structure; and
    the layered cells are arranged inside the casing.

3. The smart battery of claim 1, wherein the intelligent chip comprises: a Hall current processing unit, a composite sensing modulation and demodulation unit and a central processing unit; wherein
    the Hall current processing unit is electrically connected with the Hall current sensor; the composite sensing modulation and demodulation unit is electrically connected with the composite sensor; the Hall current processing unit and the composite sensing modulation and demodulation unit are both electrically connected with the central processing unit; and
    the Hall current processing unit is configured to demodulate a sensing signal obtained by the Hall current sensor to obtain the current of the smart battery; the composite sensing modulation and demodulation unit is configured to demodulate a change of a central wavelength of the fiber Bragg grating to obtain the pressure of the core of the smart battery and to demodulate a virtual voltage signal obtained by the thin-film temperature sensor to obtain the temperature of the core of the smart battery; the central processing unit is loaded with a battery working state management algorithm for determining the battery working state and a multi-dimensional safety signal warning logic algorithm; and the central processing unit determines the working state and a safety state of the smart battery according to signals obtained by the Hall current processing unit and the composite sensing modulation and demodulation unit.

4. The smart battery of claim 3, wherein the intelligent chip further comprises a chip substrate, an ultrasonic sensor and a voltage sensor; wherein
    the ultrasonic sensor is connected with the central processing unit; the voltage sensor is connected with the positive electrode, the negative electrode and the central processing unit; the voltage sensor is configured to detect a voltage change of the smart battery; and the ultrasonic sensor is configured to detect a structural state of the smart battery; and
    a wireless transmission unit, the Hall current processing unit, the composite sensing modulation and demodulation unit, the central processing unit, the ultrasonic sensor and the voltage sensor are all fixedly arranged on the chip substrate.

5. The smart battery of claim 3, wherein the intelligent chip further comprises a wireless transmission unit; wherein the central processing unit is connected with the wireless transmission unit; and the wireless transmission unit is configured to realize information interaction between the central processing unit and a vehicle management system and/or between the central processing unit and an internet cloud.

6. The smart battery according to claim 1, wherein the battery shell is provided with an intelligent chip groove, a battery groove, a positive electrode groove and a negative electrode groove; wherein the intelligent chip groove, the positive electrode groove and the negative electrode groove are all arranged above the battery groove, and the positive electrode groove and the negative electrode groove are symmetrically arranged with respect to the intelligent chip groove; and the intelligent chip groove is configured to receive the intelligent chip; the battery groove is configured to receive the layered cells and the embedded multi-source sensor group; the positive electrode groove is configured to receive the positive electrode; and the negative electrode groove is configured to receive the negative electrode.

7. The smart battery according to claim 6, wherein the battery shell is further provided with an explosion-proof valve; wherein the explosion-proof valve is positioned between the intelligent chip groove and the battery groove.

8. The smart battery of claim 1, wherein the layered cells are layered cells of a layered lithium ion battery.

* * * * *